(12) United States Patent
Hulsebos et al.

(10) Patent No.: US 10,901,326 B2
(45) Date of Patent: *Jan. 26, 2021

(54) METHOD OF CONTROLLING A LITHOGRAPHIC APPARATUS AND DEVICE MANUFACTURING METHOD, CONTROL SYSTEM FOR A LITHOGRAPHIC APPARATUS AND LITHOGRAPHIC APPARATUS

(71) Applicant: ASML NETHERLANDS B.V., Veldhoven (NL)

(72) Inventors: Edo Maria Hulsebos, Waalre (NL); Patricius Aloysius Jacobus Tinnemans, Hapert (NL); Ralph Brinkhof, Vught (NL); Pieter Jacob Heres, Veldhoven (NL); Jorn Kjeld Lucas, Eindhoven (NL); Loek Johannes Petrus Verhees, Reusel (NL); Ingrid Margaretha Ardina Van Donkelaar, Eindhoven (NL); Franciscus Godefridus Casper Bijnen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/808,589

(22) Filed: Mar. 4, 2020

(65) Prior Publication Data

US 2020/0201194 A1 Jun. 25, 2020

Related U.S. Application Data

(63) Continuation of application No. 16/408,605, filed on May 10, 2019, now Pat. No. 10,620,549, which is a
(Continued)

(30) Foreign Application Priority Data

Oct. 8, 2015 (EP) .................................. 15188943

(51) Int. Cl.
*G03F 7/20* (2006.01)
*G03F 9/00* (2006.01)

(52) U.S. Cl.
CPC .......... *G03F 7/70633* (2013.01); *G03F 7/705* (2013.01); *G03F 9/7003* (2013.01)

(58) Field of Classification Search
CPC ............. G03F 7/70633; G03F 7/70141; G03F 7/70508
USPC ............................................... 355/52, 53, 55
See application file for complete search history.

(56) References Cited

U.S. PATENT DOCUMENTS 8,039,181 B2 10/2011 Seltmann et al.
8,976,355 B2 3/2015 Van Der Sanden et al.
(Continued)

FOREIGN PATENT DOCUMENTS

CN 1751378 3/2006
CN 101006558 7/2007
(Continued)

OTHER PUBLICATIONS

International Search Report and Written Opinion dated Jan. 2, 2017 in corresponding International Patent Application No. PCT/EP2016/071831.
(Continued)

*Primary Examiner* — Hung Nguyen
(74) *Attorney, Agent, or Firm* — Pillsbury Winthrop Shaw Pittman LLP (57) ABSTRACT

In a method of controlling a lithographic apparatus, historical performance measurements are used to calculate a process model relating to a lithographic process. Current posi-
(Continued)

tions of a plurality of alignment marks provided on a current substrate are measured and used to calculate a substrate model relating to a current substrate. Additionally, historical position measurements obtained at the time of processing the prior substrates are used with the historical performance measurements to calculate a model mapping. The model mapping is applied to modify the substrate model. The lithographic apparatus is controlled using the process model and the modified substrate model together. Overlay performance is improved by avoiding over- or under-correction of correlated components of the process model and the substrate model. The model mapping may be a subspace mapping, and dimensionality of the model mapping may be reduced, before it is used.

22 Claims, 4 Drawing Sheets

Related U.S. Application Data continuation of application No. 15/763,780, filed as application No. PCT/EP2016/071831 on Sep. 15, 2016, now Pat. No. 10,331,040.

(56) References Cited

U.S. PATENT DOCUMENTS

| 9,310,698 | B2 | 4/2016 | Menchtchikov et al. |
| 10,620,549 | B2* | 4/2020 | Hulsebos ............ G03F 7/70633 |
| 2010/0028790 | A1 | 2/2010 | Seltmann et al. |
| 2013/0035888 | A1 | 2/2013 | Kandel et al. |
| 2013/0141723 | A1 | 6/2013 | Wei et al. |
| 2013/0230797 | A1 | 9/2013 | Van Der Sanden et al. |
| 2016/0334712 | A1* | 11/2016 | Cekli ................... G03F 9/7092 |
| 2018/0067900 | A1* | 3/2018 | Mos .................... G03F 7/70633 |

FOREIGN PATENT DOCUMENTS

| EP | 1603153 | 12/2005 |
| EP | 1804278 | 7/2007 |
| TW | I394008 | 4/2013 |
| TW | 201516598 | 5/2015 |
| WO | 2014/146906 | 9/2014 |
| WO | 2015/049087 | 4/2015 |
| WO | 2015046087 | 4/2015 |
| WO | 2015049087 | 4/2015 |

OTHER PUBLICATIONS

English translation of Taiwan Office Action dated Aug. 23, 2017 in Taiwan Patent Application No. 105131895.
Cherry, Gregory A., et al., "Multiblock Principal Component Analysis Based on a Combined Index for Semiconductor Fault Detection and Diagnosis," IEEE Transactions on Semiconductor Manufacturing, vol. 19, No. 2, pp. 159-172 (2006).
Chinese Office Action issued in corresponding Chinese Patent Application No. 2016800714263, dated Oct. 8, 2019.
Korean Office Action issued in corresponding Korean Patent Application No. 10-2018-7013051, dated Oct. 28, 2019.

* cited by examiner

METHOD OF CONTROLLING A LITHOGRAPHIC APPARATUS AND DEVICE MANUFACTURING METHOD, CONTROL SYSTEM FOR A LITHOGRAPHIC APPARATUS AND LITHOGRAPHIC APPARATUS

This application is a continuation of U.S. patent application Ser. No. 16/408,605, filed May 10, 2019, now U.S. Pat. No. 10,620,549, which is a continuation of U.S. patent application Ser. No. 15/763,780, filed Mar. 27, 2018, now U.S. Pat. No. 10,331,040, which is the U.S. national phase entry of PCT Patent Application No. PCT/EP2016/071831, which was filed on Sep. 15, 2016, which claims the benefit of priority of European patent application no. 15188943.3, which was filed on Oct. 8, 2015, each of the foregoing applications is incorporated herein in its entirety by reference.

FIELD

The present description relates to inspection apparatus and methods usable, for example, to perform metrology in the manufacture of devices by lithographic techniques. The description further relates to an illumination system for use in such inspection apparatus and to methods of manufacturing devices using lithographic techniques. The description yet further relates to computer program products for use in implementing such methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Prior to applying patterns to a wafer using a lithographic apparatus, the wafer generally needs to be measured and modelled so as to properly align the wafer and to correct wafer deformations during patterning. A critical performance measure of the lithographic process is overlay, the accuracy of alignment of features in two layers in a device (or between features formed by two patterning steps in the same layer). Alignment sensors having multiple color channels are used in the known lithographic apparatus, to try and obtain the best possible position measurements prior to patterning. These position measurements are used to calculate a substrate model for each wafer.

To improve overlay, additional measurements are made of performance on prior substrates that have been patterned, to identify and correct deviations introduced in the patterning step and/or other steps. Various tools for making such measurements are known, including scanning electron microscopes, which are used to measure performance parameters such as overlay.

SUMMARY

Recently, various forms of scatterometers have been developed for use in the lithographic field, which allow high volume measurements. Typically these measurements made over many prior substrates, provide far greater spatial detail than can be obtained with alignment measurements made on a current wafer in the course of patterning. Accordingly, types of measurements are used in advanced process control (APC) methods for a modern lithographic production facility. A substrate model based on the measurements of the current wafer provides wafer-specific corrections, while a process model (or multiple models) provides additional corrections to correct for systematic errors in the machine, for example alignment errors. The cause for these errors often lies in other processing steps, like CMP (chemical and mechanical polishing) and etching, which cause a deformation of the alignment marks. This deformation of the mark results in alignment errors that vary from wafer to wafer, when alignment measurements are made in the lithographic apparatus prior to patterning. Because the process model is based on sampling many wafers over time, it can also be provided with (for example) greater spatial resolution and sensitivity to many other variables.

Because the process model is designed to implement variations varying slowly over time, it is not sensitive to wafer-to-wafer variations. The alignment measurements made on each wafer are sensitive to wafer-to-wafer variations. By using a process model in addition to a substrate model, it has been possible to achieve the high overlay performance required for modern device manufacture. Nevertheless, there is a constant quest to improve even further the performance of lithographic processes. This is to improve yield and consistency of existing devices, and to allow even smaller devices to be produced in future.

The inventors have recognized that correlation between the two models can result in over- or under-correction of errors in some cases, so that some overlay error remains, that is in principle correctable.

The present description describes apparatuses and methods to improve overlay performance in lithographic processes. One aim is to eliminate or reduce the over- or under-correction of errors that results from correlation between the substrate model and the process model in known methods. Another aim is to integrate into one method different types of corrections and optimizations that have been implemented in isolation up to now.

According to an aspect, there is provided a method of controlling a lithographic apparatus, the method including the steps of:
 (a) obtaining historical performance measurements representing performance of a lithographic process in applying patterns to a plurality of prior substrates;
 (b) using the historical performance measurements to calculate a process model relating to the lithographic process;
 (c) after loading a current substrate into a lithographic apparatus, measuring current positions of a plurality of alignment marks provided on the current substrate;
 (d) using the measured current positions to calculate a substrate model relating to the current substrate; and
 (e) controlling the lithographic apparatus using the process model and the substrate model together,
 wherein the method further comprises:
 (f) obtaining historical position measurements obtained at the time of processing the prior substrates;
 (g) using the historical position measurements and historical performance measurements together to calculate a model mapping; and (h) applying the model mapping to modify the substrate model calculated in step (d) and using the modified substrate model in step (e).

In an aspect, there is provided a control system for a lithographic apparatus, the control system comprising:

storage for historical performance measurements representing performance of a lithographic process in applying patterns to a plurality of prior substrates;

a process model processor arranged to use the historical performance measurements to calculate a process model relating to the lithographic process;

a measurement controller for causing to cause measurement of current positions of a plurality of alignment marks provided on a current substrate loaded into the lithographic apparatus;

a substrate model processor arranged to use the measured current positions to calculate a substrate model relating to the current substrate;

storage for historical position measurements obtained at the time of processing the prior substrates;

a model mapping processor arranged to use the historical position measurements and historical performance measurements together to calculate a model mapping; and a patterning controller arranged to control the lithographic apparatus using the process model and the modified substrate model together.

The various storage, controllers and processors of the control system are identified by their functions in the above summary, and two or more of these functions may be implemented using common hardware. They may in particular be implemented by programming one or more processors and controllers already present within a lithographic apparatus, an advanced process control system and/or a metrology system.

The model mapping is a mathematical mapping between a parameter space of the substrate model and a parameter space used by the lithographic apparatus for controlling the patterning. By comparing the historical performance data and the historical alignment data, a model mapping can be established that reduces the problems identified above.

Any parameterized model can be used as the substrate model and the process model. In some embodiments, the process model is a two-dimensional polynomial of, for example, a third or fifth order polynomial. In other embodiments, a set of radial basis functions may be used.

In an aspect, there is provided a method of manufacturing devices wherein product structures are formed on a series of substrates by a lithographic process, wherein properties of the product structures on one or more processed substrates are measured by a method as described herein, and wherein the measured properties are used to adjust parameters of the lithographic process for the processing of further substrates.

In an aspect, there is provided a lithographic apparatus including a control system as described herein.

In an aspect, there is provided a computer program product containing one or more sequences of machine-readable instructions for implementing calculating steps in a method as described herein.

These and other aspects and advantages of the apparatus and methods disclosed herein will be appreciated from a consideration of the following description and drawings of exemplary embodiments.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
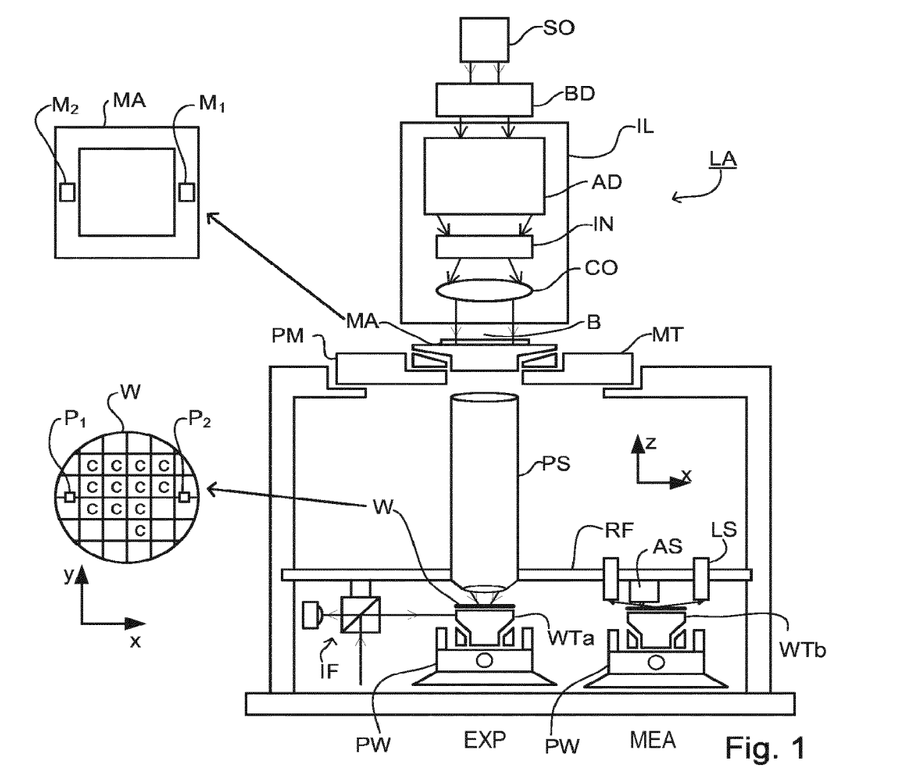
FIG. 1 depicts a lithographic apparatus suitable for use in an embodiment of the present invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation. For example, in an apparatus using extreme ultraviolet (EUV) radiation, reflective optical components will normally be used.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
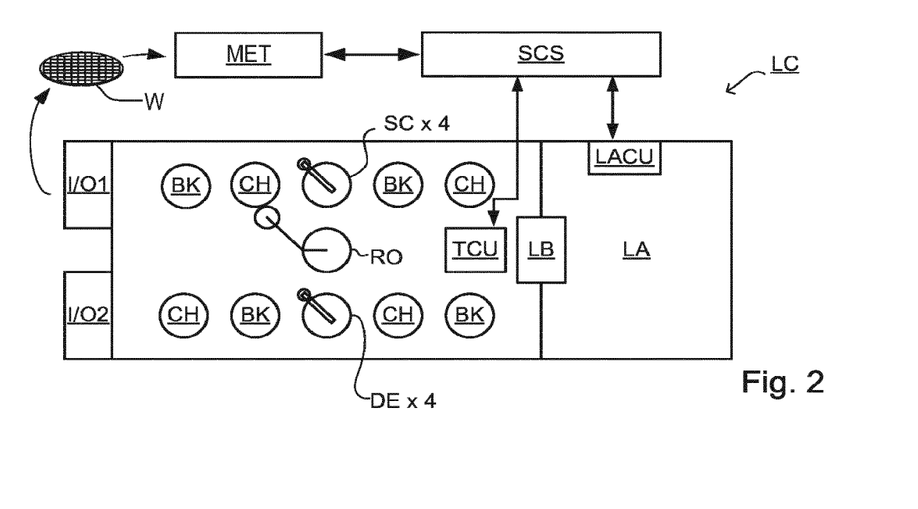
FIG. 2 depicts a lithographic cell or cluster in which an inspection apparatus according to an embodiment of the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it may be desirable that the inspection apparatus measure properties in the exposed resist layer immediately after the exposure. However, not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

The metrology step with metrology system MET can also be done after the resist pattern has been etched into a product layer. The latter possibility limits the possibilities for rework of faulty substrates but may provide additional information about the performance of the manufacturing process as a whole.

Alignment Process Background

Figure 3:
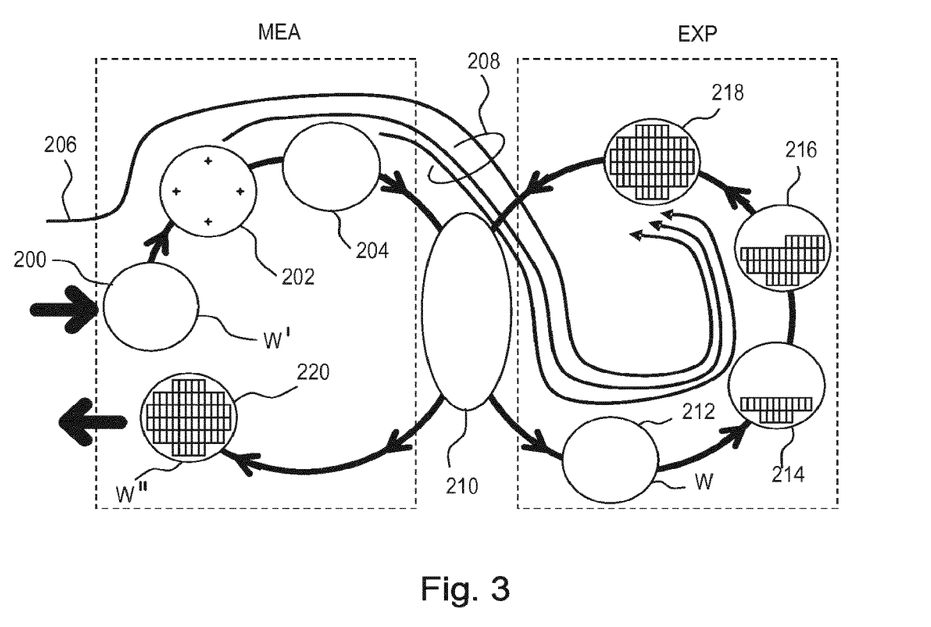
FIG. 3 illustrates schematically measurement and exposure processes in the apparatus of FIG. 1, according to known practice.

FIG. 3 illustrates the steps to expose target portions (e.g. dies) on a substrate W in the dual stage apparatus of FIG. 1. The process according to conventional practice will be described first.

On the left hand side within a dotted box are steps performed at measurement station MEA, while the right hand side shows steps performed at exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W is loaded to the apparatus by a mechanism not shown. These two substrates are processed in parallel in order to increase the throughput of the lithographic apparatus.

Referring initially to the newly-loaded substrate W, this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. Each patterning step can introduce positional deviations in the applied pattern, while subsequent processing steps progressively introduce distortions in the substrate and/or the pattern applied to it, that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation. Some layers may be patterned by steps that are alternative or supplementary to exposure in the illustrated lithographic apparatus. Such alternative and supplementary techniques include for example imprint lithography, self-aligned multiple patterning and directed self-assembly.

At 202, alignment measurements using the substrate marks P1 etc. and image sensors (not shown) are used to measure and record alignment of the substrate relative to substrate table WTa/WTb. In addition, several alignment marks across the substrate W will be measured using alignment sensor AS. These measurements are used in one embodiment to establish a substrate model (sometimes referred to as the "wafer grid"), which maps very accurately the distribution of marks across the substrate, including any distortion relative to a nominal rectangular grid.

At step 204, a map of wafer height (Z) against X-Y position is measured also using the level sensor LS. Primarily, the height map is used only to achieve accurate focusing of the exposed pattern. It may be used for other purposes in addition.

When substrate W was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. As described further in U.S. patent application publication no. US 2013-230797, advanced models are known that use more parameters.

At 210, wafers W and W are swapped, so that the measured substrate W becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W) in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W' is unloaded from the apparatus at step 220, to undergo etching or other processes, in accordance with the exposed pattern.

Advanced Process Control using Historical Performance Data

Figure 4:
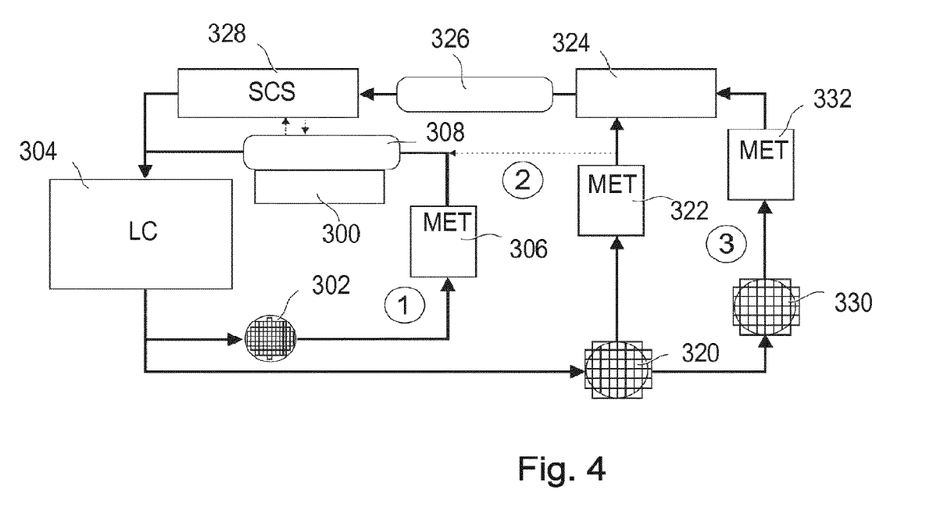
FIG. 4 is a schematic diagram of an advanced process control method for controlling the apparatus of FIG. 1 according to known practice.

For best performance, historical performance data relating to the lithography process are generally used in addition to measurements made when a current substrate is loaded into the lithographic apparatus. For this purpose, measurements of performance are made with the metrology system MET (FIG. 2). Different forms of advanced process control can be implemented. FIG. 4 illustrates only one example, implementing a known stability control method.

FIG. 4 depicts a stability module 300. This module is for example an application running on a processor, for example within the control unit LACU or the supervisory control system SCS of FIG. 2. Shown are three main process control loops, labeled 1, 2, 3. The first loop provides local control of the lithography apparatus using the stability module 300 and monitor wafers. A monitor wafer 302 is shown being passed from a lithography cell 304, which may be the lithocell LC of FIG. 2 for example. Monitor wafer 304 has been exposed with a calibration pattern to set 'baseline' parameters for focus and overlay. At a later time, a metrology tool 306 reads these baseline parameters, which are then interpreted by the stability module 300 so as to calculate stability corrections 308 specific to this lithocell. This performance data can be fed back to the lithography cell 304, and used when performing further exposures. The exposure of the monitor wafer may involve printing a pattern of marks on top of reference marks. By measuring overlay error between the top and bottom marks, deviations in performance of the lithographic apparatus can be measured, even when the wafers have been removed from the apparatus and placed in a metrology tool.

The second (APC) control loop is based on measurements of performance parameters such as focus, dose, and overlay on actual product wafers. An exposed product wafer 320 is passed to metrology tool 322, which may be the same or different to the metrology tool 306 in the first control loop. At 322 information relating for example to parameters such as critical dimension, sidewall angles and overlay is determined and passed to an Advanced Process Control (APC) module 324. This data is also passed to the stability module 300. Process corrections 326 are calculated and used by the supervisory control system (SCS) 328, providing control of the lithocell 304, in communication with the stability module 300.

The third control loop is to allow metrology integration into the second (APC) control loop, for example in double patterning applications. An etched wafer 330 is passed to metrology unit 332 which again may be the same or different to the metrology tool 306, 322 used in the first and/or second control loop. Metrology tool 332 measures performance parameters such as critical dimensions, sidewall angles and overlay, read from the wafer. These parameters are passed to the Advanced Process Control (APC) module 324. The loop continues the same as with the second loop.

Substrate Model Mapping—Background

For overlay performance, new patterns should be positioned correctly relative to patterns already on the substrate, not merely positioned at some nominally 'correct' position. From the above description, it will be understood that several different mechanisms are implemented to achieve high performance in parameters such as overlay.

Figure 5:
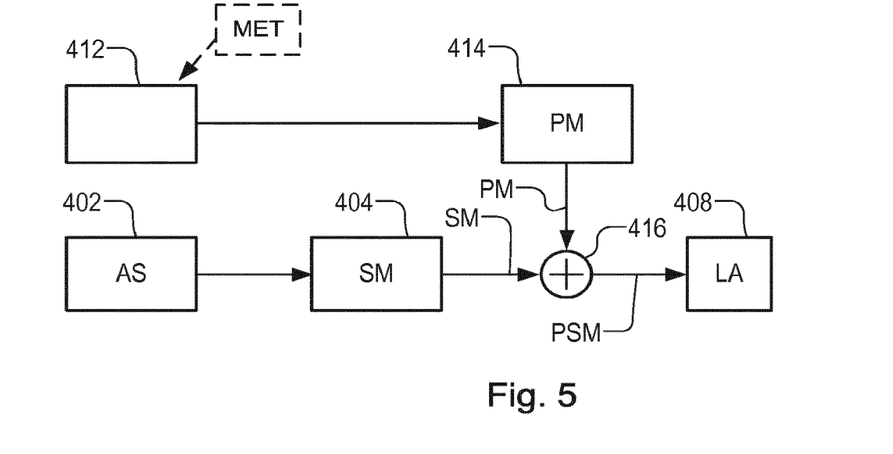
FIG. 5 illustrates the implementation of a substrate model and a process model in the method of FIG. 4.

FIG. 5 summarizes these mechanisms, as they relate to a patterning operation on a current substrate, in the known method of controlling the lithographic apparatus LA. At 402 positional deviations of a current substrate are measured by the lithographic apparatus using its alignment sensors AS, in the manner described with reference to FIG. 3. At 404 a substrate model SM is calculated from the position measurements of the current substrate that allows substrate-specific corrections to be applied by the lithographic apparatus at 408 when a pattern is applied.

In addition, at 412 measurements of performance on prior substrates are stored to provide historical performance data. This historical performance data is used at 414 to calculate one or more process models PM representing the performance of the particular lithographic apparatus and other processing equipment relevant to the current substrate. These calculations may for example the ones done in the control loops of the example of FIG. 4.

At 416 the substrate model and the process model(s) are combined to create a complete substrate and process correction model PSM. Using the combined model, lithographic apparatus 408 calculates corrections so that a new pattern can be applied to each substrate, correcting not only for positional deviations in the features already on the substrate, but also for deviations in performance of the patterning and other processing steps.

Ideally, the substrate model would correct only those deviations that are not corrected by the process model, and vice versa. The inventors have recognized that in the known system, an element of correlation can arise between alignment deviations corrected via a substrate model and overlay errors corrected via a process model. Such correlation can result in over-correction or under-correction of errors. According to the present disclosure, by identifying and eliminating these correlations, the performance of the lithographic process as a whole can be further improved, particularly in terms of overlay.

While a process model PM and a substrate model SM may be referred to in the singular, the skilled reader will understand that either or both of these models may be a superposition of two of more sub-models. The process model may comprise sub-models for performance of the lithographic apparatus and performance of the other processing steps, but all models based on the historical performance data are simply regarded to as the process model, for simplicity in the present disclosure. As a common example, the process model may comprise an inter-field model and an intra-field model. The inter-field model represents variations in performance that are related to position over the substrate, while the intra-field model represents variations that tend to repeat in each target portion (field) of the substrate. Each of these can be further sub-divided into sub-models. Either or both of these models may comprise a sub-model specific to a particular product design and a sub-model common to a number of product designs. Additional models can apply corrections for transient effects, such as heating of the lens, the reticle and/or the substrate. The stability module creates another sub-model, representing day-to-day drift of actual performance from a process model based on historical performance measurements.

Similarly, the substrate model may in practice comprise a combination of two or more sub-models. Commonly for example, a four-parameter (4PAR) model will be fitted first. A second model with higher order variations is then fitted on the residuals of the 4PAR model. (The residuals include positional deviations not modeled by the 4PAR model.) The higher order model may be for example a six-parameter (6PAR) model, a $3^{rd}$ order polynomial model, or a model based on radial basis functions. The term 'substrate model' therefore encompasses combination of two or more sub-models. Furthermore, as with the process model, the substrate model can comprise an intra-field model as well as inter-field model. In one example, multiple alignment marks are measured for a small number of fields on the current substrate, and are used to fit an intra-field substrate model. In that case, the substrate model is effectively a combination of three sub-models: a 4PAR substrate model, higher order inter-field substrate model and an intra-field substrate model. Each successive model represents smaller and smaller deviations, but each one helps to reduce overlay another small amount, which is critical in modern semiconductor manufacturing.

Figure 6:
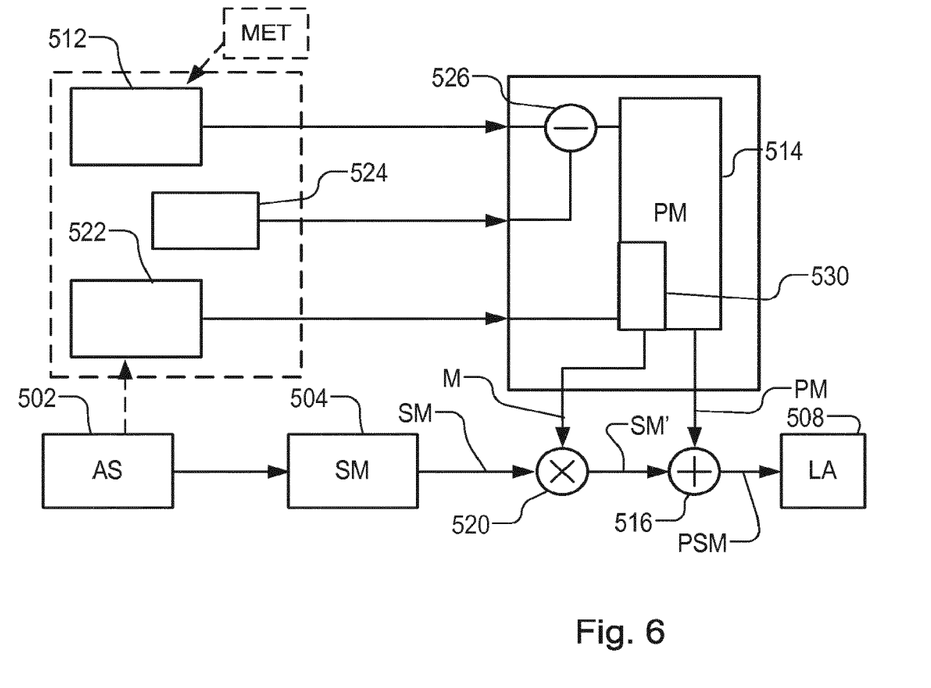
FIG. 6 illustrates the implementation of a modified method with model mapping in accordance with a first embodiment of the present invention.

FIG. 6 shows a modified method of controlling the lithographic apparatus, implementing substrate model mapping to address the problems caused by correlation between the substrate model and the process model in the known processes. Steps 502 to 516 correspond to the like-numbered steps 402 to 416 in the known method of FIG. 5. Some additional steps and details will be described, which are for implementing the substrate model mapping. The substrate model mapping will be described firstly in overview. Further below, a mathematical basis and more detail of an example implementation will be provided.

Compared with the method of FIG. 5, the principal change in the method of FIG. 6 is that at step 520 a substrate model mapping is applied to the substrate model SM, before it is combined with the process model PM at step 516. The applied mapping is defined in one example by a mapping matrix M. Within step 514 the mapping to be applied is calculated, as well as the process model PM. To do this, step 514 receives not only historical performance data 512, but also corresponding historical position measurements stored at 522. These comprise the alignment measurements that were obtained by the (same or another) lithographic apparatus, at the time when the prior substrates were patterned. They are used in combination with the historical performance data, to identify and suppress correlations of the type described above. In addition to the historical position measurements, associated historic corrections 524 are stored and used in step 514. Specifically, at 526 the corrections that were applied during patterning of each prior substrate are effectively undone (for example, subtracted from the historical performance data), to recreate the actual positional deviations that were present on the prior substrates before using corrections. These actual positional deviations (as best they can be known from the measurements taken before and after the prior patterning) represent the optimal corrections that could have been applied at the time of patterning each prior substrate.

As an alternative to storing actual corrections at step 524, what could be stored is a definition of the models and corrections that were applied in the processing of the prior substrate. Given the historical position data and the historical performance data relating to a given prior substrate, the corrections that would have been applied can be recreated. At step 530, the actual positional deviation and the measured positional data for each prior substrate are compared to identify the correlations mentioned above. The identified correlations are used to define the process model and the substrate model mapping applied at 520. The substrate model after the mapping has been applied is labeled SM'.

The substrate model mapping may be expressed for example in the form of a matrix M, as described further below. The substrate model mapping may be a linear projection, or a nonlinear projection. Generally speaking, each model SM, PM will be expressed in a multidimensional space defined by a respective set of parameters. The set of parameters may be first order transformation parameters, such as a the well-known 6PAR model defining simple rotations and magnifications. The set of parameters may be for a higher order model, such as a third order or fifth order polynomial model. The polynomials may be in Cartesian coordinates X and Y, or they may be in coordinates providing rotational symmetry modes, such as Zernike polynomials. In some embodiments, the model mapping may be a mapping from a multidimensional space occupied by the substrate model to a different multidimensional space occupied by the process model.

The model mapping may be a subspace mapping. The number of degrees of freedom in the substrate model may be different from the number of degrees of freedom in the process model. Typically, the number of measurements made on every current substrate at step 402 or 502 is far lower than the number of measurements that can be made on a few substrates in the off-line metrology tools 306, 322, 332. Therefore fine spatial detail will typically be concentrated in the inter-field and intra-field process model, while the substrate model SM describes broader deviations. In a modern example process, the substrate model may be for example a third order polynomial model. A third order polynomial in spatial dimensions X and Y may have twenty or so parameters, each representing a different degree of freedom. (Within this model there are actually two 10-parameter models: one for deviations in the X direction, and one for deviations in the Y direction. With another model deviations in both directions may be represented together.) The process model PM may be for example a fifth order model, having 42 parameters and consequently a greater number of degrees of freedom than the substrate model. The combined substrate and process model PSM will have a similar number of degrees of freedom. In some examples, the parameters of the process model are a superset of the parameters of the substrate model, so that the combination at step 416 is a simple addition. In other cases, some transformation between multidimensional spaces may need to be performed before the addition. This is a detail of implementation. In either case, the substrate model mapping at step 520 can exploit these additional degrees of freedom to reduce the effects of correlation, mentioned above.

After the model mapping, the dimensions of the substrate model SM' are not increased in number, and they may even be reduced. However (in the example of a linear mapping) they are expressed now in terms of base vectors in the higher-dimensional parameter space of the combined substrate and process model PSM, and not constrained to the degrees of freedom of the original substrate model. As mentioned, nonlinear mapping can also be envisaged, and linear mappings are used only as an example. The case where the process model has more degrees of freedom than the substrate model is only a typical situation, and not a requirement for benefiting from the model mapping method disclosed herein.

The dimensionality of the subspace mapping may be further reduced, before it is used in step 520. As explained below, this can be useful to eliminate insignificant components, or components that might amplify the effect of changes in the process in the finished model. As explained further below, the dimensionality may be reduced by performing a singular value decomposition (SVD) of a model mapping matrix and modifying certain components in a scaling matrix of the singular value decomposition. SVD is only one example of a suitable method, and other methods may be used, such as principal component analysis, canonical variate analysis (CVA), also called canonical correlation analysis (CCA) or a discrete empirical interpolation method (DEIM).

Substrate Model Mapping—Mathematical Basis & Implementation

To explain the theory and implementation of the technique described above, some definitions and notations are set out. For convenience and familiarity with semiconductor processing, wafers will be referred to as an example of substrates. The substrate model SM can be referred to as the wafer alignment model. The methods disclosed herein may be applied to other types of substrates, not only semiconductor wafers.

Assume a matrix X to be the wafer alignment model parameters obtained from alignment sensor measurements on multiple wafers. These parameters may be for example twenty coefficients for a third order polynomial model. The dimensions of the matrix are thus the number of wafers times the number of parameters in the wafer alignment model ($X=[n_{wafers} \times n_{params}]$). Note that the model can be defined to represent deviation from an ideal grid, or designed to represent fully the absolute position of points on the wafer. Both can be the case, for different sub-models. In one example, let the model contain the full absolute position (nominal position plus position deviation) but the nominal position is captured in a 4PAR model. The higher-order models (polynomial or radial basis function, for example) are then only representing the residual. This is just a choice of implementation. Define OVL to be the parameters (for example fifth order polynomial coefficients) corresponding to the overlay measurement results (historical performance data) for the same wafers. For simplicity of argument, assume that the wafer alignment model parameters are a subset (or subspace) of the overlay model parameters, so that simple operations can be performed like adding/subtracting on them. (If they are not, they would need to be transformed before being added/subtracted.)

In the lithographic apparatus step 408/508, corrections are derived from the models described above. Then denote the wafer alignment corrections as $C_{wa}$, which are the expose corrections derived for each wafer from the wafer alignment model (substrate model SM in FIGS. 4 and 5). Then denote the process corrections (calculated for example by the APC control loops of FIG. 4) as $C_{apc}$. Note that all these are matrices describing parameters of multiple wafers, just like X. From these parameters the best estimation of the optimal correction Y can be derived as:

$$Y = C_{wa} + C_{apc} - OVL \tag{1}$$

As explained already with reference to FIG. 6, the optimal correction is what should (with hindsight based on the historical performance data) have been corrected during patterning (exposure), to obtain perfect overlay. Note that, although multiple wafers are represented in these matrices, this equation calculates the "best" corrections on a single wafer basis. Each column of the matrix X represents a different parameter and each row of the matrix represents a different wafer: $X=[n_{wafers} \times n_{params}]$ The minus-sign before OVL comes from the fact that during overlay measurement, what is measured is positions of features in a second layer minus positions of features in a first layer. Wafer alignment is based on measurements of the first layer only, before the pattern is applied. Note that it is impossible to use these "optimal corrections" Y in the patterning step, as the exposure is done before the OVL error can be measured. However, as seen in the APC control loops in the method of FIG. 4, overlay and alignment data from prior substrates, can be used to correct operations on a current substrate and on one or more future substrates.

The known APC control loop aims to calculate optimal corrections based on alignment and overlay data from the prior wafers, trying to approximate the "true wafer deformation" Y as well as possible, by the combination of substrate corrections based on measured deformation of the current wafer (substrate model SM) plus process corrections obtained from historical data, using the APC control loops (process model PM):

$$Y \approx X + C_{apc} \tag{2}$$

The process corrections in the APC control loops are currently updated by means of an inline calibration, which in a simplified way can be written as:

$$C_{apc-new} = \overline{Y} - \overline{X} = \overline{C}_{apc} - \overline{OVL} - \overline{X}, \tag{3}$$

where $\overline{X}$ denotes the mean of X over multiple wafers, C is the newly calibrated process corrections for future wafers and $\overline{C}_{app}$ are the actual applied process corrections on the past wafers.

Now, the modified method illustrated in FIG. 6 consists of replacing the approximation method for the known process correction (equation (2)) by a new equation:

$$Y \cong XM + C_{apc} \quad (4)$$

Equation (4) involves matrix multiplication as well as APC process corrections. Matrix M can be considered as a model mapping matrix, defining a mapping from the wafer alignment model parameter space (X) to the overlay model parameter space (Y). By adding this model mapping step (step 520), the modified control method has the potential to improve overlay still further than the current method from equation (2). Calibrations calculations in the control loops can be modified to calculate not only the process corrections $C_{app}$, but also the model mapping matrix M. If it is desired to use nonlinear mapping, then a more generalized mapping function, rather than a mapping matrix, can be used.

Calculation of the model mapping based on historical data can be done by any suitable training method. An approach similar to a Wiener filter can be applied, using the following equations:

$$M = pinv(X - \overline{X})Y \quad (5)$$
$$= pinv\{(X - \overline{X})'(X - \overline{X})\}(X - \overline{X})'Y$$
$$C_{apc} = \overline{Y} - \overline{X}M.$$

where piny represents a pseudo-inverse function, and indicates the transpose of a matrix. The second line in Equation (5) is presented only to illustrate the similarity with a Wiener filter. Both the model mapping matrix M and process corrections $C_{apc}$, can be trained using overlay and wafer alignment measurements from the past, for example as part of a modified APC control loop. The training effectively identifies the correlation between wafer alignment and overlay. Use of the model mapping effectively removes from the substrate model contributions that will be corrected through the process model. Over-correction or through the mapped substrate model, but over-correction and under-correction of correlated contributions is eliminated.

Subspace Mapping

As mentioned above, dimensionality of the mapped substrate model can also be reduced, for example by application of known statistical techniques. By applying a Singular Value Decomposition to matrix M, for example, equation (4) can be written as $$Y \cong XUSV' + C_{apc}, \quad (6)$$

where U and V are orthogonal coordinate transformation matrices and S is a diagonal matrix containing the singular values of matrix M. The expressions XU and YV can in this case be considered as subspaces of the parameter space of X and Y, respectively. Each subspace has dimensions defined by a base vector in terms of the parameters of the parameter space. Each single base vector from XU is mapped onto a single base vector YV with the corresponding singular value from S as a scaling factor. By deleting selected singular values (setting them to zero), one can limit the mapping to a linear subspace of the original model parameter spaces.

Deleting singular values is equivalent to removing columns of the matrices U and V. Note that values in S, XU and YV can be used to select which "subspace" parameters to reject and which to maintain. For example, S provides the scaling of the parameter. If the scaling factor is very low (close to 0) this means that the subspace base vector is irrelevant for overlay, and may be discarded. Discarding these terms helps to reduce processing, and leaves the significant contributions more visible, if one wants to gain insight into the causes of overlay error. For example, a pattern of positional deviations that is introduced by the lithographic apparatus in a current layer, may in practice be the same as a pattern of deviations introduced by the same apparatus in exposing a previous layer. This is an example of an error that may be present but is irrelevant for overlay and so should not be corrected by the substrate model, even if it appears in the measurements of the substrate, and could at first sight be corrected in the substrate model. More significantly, if S provides an (extremely) large singular value (scaling factor) in combination with a very weak model parameter in XU, one may want to delete such a base vector. Such a contribution is not robust or reliable, and could introduce relatively large errors in the presence of random variations in the input measurements.

With or without subspace mapping, once the model mapping matrix M has been calculated for the historical data, it can be delivered to the lithographic apparatus for use in mapping the substrate model in the manner shown in FIG. 6. Overlay on the current substrates is thus improved. The model mapping can be delivered for example as part of the recipe data 206 seen in FIG. 3.

As an additional benefit, the method can also improve the correction of wafer-specific deformations that are not directly correctable in the substrate model (due to the restricted degrees of freedom), but are correlated with parameters of the substrate model.

Application to Multi-Color Alignment

The modified method can be used to implement improvements that would otherwise require specific steps in the control method. As an example, it is known that the response of the alignment sensor AS is different at different wavelengths (colors), and each application requires a different color or combination of colors to depending on the particular materials and processing of a given substrate. Alignment marks can be hard to "see" as they become buried under subsequent product layers. Moreover the marks themselves can become deformed during processing, making the alignment sensor results more color-dependent. One method to address this is to use multiple colors in the alignment sensor, and to select a "best" signal from among the colors, or to use a weighted combination of colors. An example of such a sensor is described for example in PCT patent application publication no. WO 2014-146906. In some embodiments, different polarizations may be used in addition to different colors.

Figure 7:
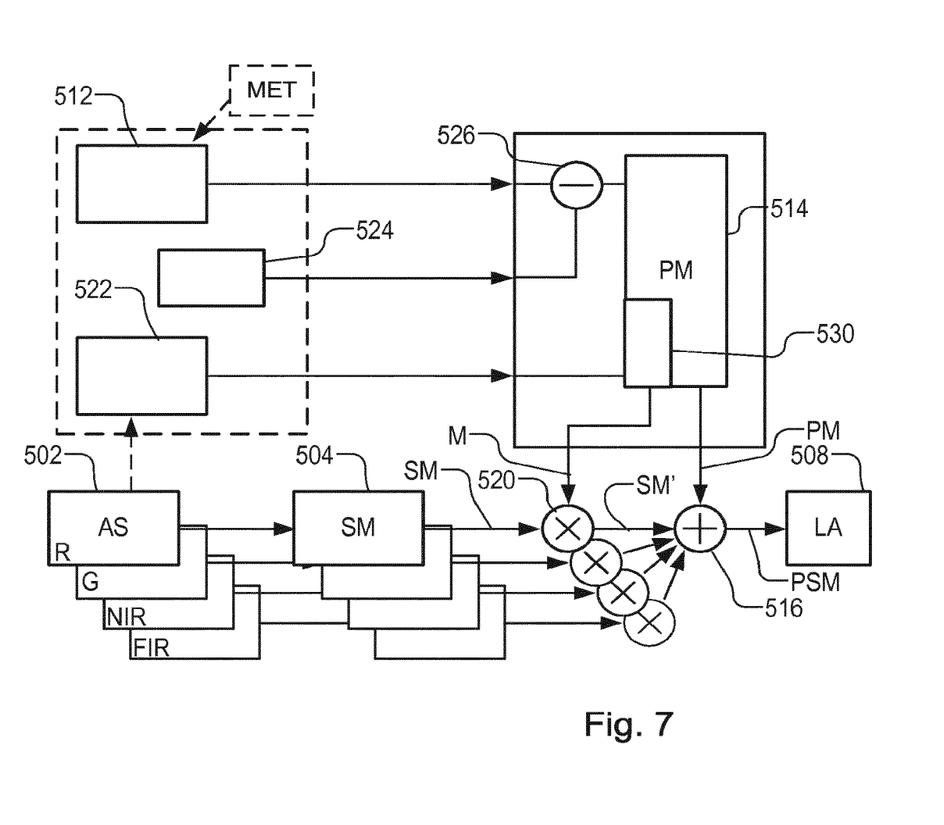
FIG. 7 illustrates the implementation of a modified method with model mapping in accordance with a second embodiment of the present invention.

As shown in FIG. 7 the model mapping method can be readily adapted to implement selection and weighting of different color signals. The steps and components of the method are the same as in FIG. 6, but with four color channels shown in the alignment sensor and substrate model. The color channels are labeled R (red), G (green), NIR (near infrared) and FIR (far infrared). Another alignment sensor might have more channels. Each color channel has its own substrate model SM with a full set of parameters. Rather than trying separately to determine a best channel to use for a given substrate the training method can simply derive a best substrate model from all the color signals in combination. In an embodiment using singular value decomposition, the color channel that yields the most reliable position signals will end up with the strongest scaling factors in matrix S. Another channel will have lower scaling factors, or zero.

As mentioned, another alignment sensor may have channels for different polarizations of light, in addition to different colors. In the present description, different colors can be regarded as just one example of using different characters of radiation. These different characters can be defined by their combination of wavelength, polarization, illumination profile or any other parameters that may be found useful to discriminate the alignment mark in different process conditions.

Further embodiments are provided in below numbered clauses:

1. A method of controlling a lithographic apparatus, the method comprising:
   (a) obtaining historical performance measurements representing performance of a lithographic process in applying patterns to a plurality of prior substrates;
   (b) using the historical performance measurements to calculate a process model relating to the lithographic process;
   (c) after loading a current substrate into a lithographic apparatus, measuring current positions of a plurality of alignment marks provided on the current substrate;
   (d) using the measured current positions to calculate a substrate model relating to the current substrate;
   (e) controlling the lithographic apparatus using the process model and the substrate model together,
   (f) obtaining historical position measurements obtained at the time of processing the prior substrates;
   (g) using the historical position measurements and historical performance measurements together to calculate a model mapping; and
   (h) applying the model mapping to modify the substrate model calculated in step (d) and using the modified substrate model in step (e).
2. A method according to clause 1, wherein the model mapping is a subspace mapping, mapping from a multidimensional space occupied by the substrate model to a subspace of a multidimensional space occupied by the process model.
3. A method according to clause 2 wherein step (f) further comprises reducing a dimensionality of the subspace mapping before it is used in step (g).
4. A method according to clause 3 wherein reducing the dimensionality comprises performing a singular value decomposition of a subspace mapping matrix and modifying certain components in a scaling matrix of the singular value decomposition.
5. A method according to clause 4 wherein modifying certain components of the scaling matrix comprises setting those components to zero.
6. A method according to clause 3 wherein reducing the dimensionality comprises performing at least one of: principal component analysis, a canonical variate analysis, a canonical correlation analysis or a discrete empirical interpolation method.
7. A method according to any of clauses 1 to 6 wherein in step (g) the historical performance measurements and historical position measurements are used together with historical correction data representing corrections that were applied in processing the prior substrates.
8. A method according to any of clauses 1 to 7 wherein the substrate model is calculated with fewer degrees of freedom than the process model.
9. A method according to clause 8 wherein the model mapping expresses the substrate model using the same degrees of freedom as the process model.
10. A method according to clause 8 or 9 wherein the degrees of freedom of the process model are a superset of the degrees of freedom of the substrate model.
11. A method according to any of clauses 1 to 10 wherein the process model comprises an inter-field model and an intra-field model.
12. A method according to any of clauses 1 to 11 wherein the substrate model comprises an inter-field model and an intra-field model.
13. A control system for a lithographic apparatus, the control system comprising:
    storage for historical performance measurements representing performance of a lithographic process in applying patterns to a plurality of prior substrates;
    a process model processor arranged to use the historical performance measurements to calculate a process model relating to the lithographic process;
    a measurement controller for causing measurement of current positions of a plurality of alignment marks provided on a current substrate loaded into the lithographic apparatus;
    a substrate model processor arranged to use the measured current positions to calculate a substrate model relating to the current substrate;
    storage for historical position measurements obtained at the time of processing the prior substrates;
    a model mapping processor arranged to use the historical position measurements and historical performance measurements together to calculate a model mapping; and
    a patterning controller arranged to control the lithographic apparatus using the process model and the modified substrate model together.
14. A control system according to clause 13, wherein the model mapping is a subspace mapping, mapping from a multidimensional space occupied by the substrate model to a subspace of a multidimensional space occupied by the process model.
15. A control system according to clause 14 wherein the model mapping processor is further arranged to reduce a dimensionality of the subspace mapping before it is used to modify the substrate model.
16. A control system according to clause 14 wherein reducing the dimensionality comprises performing a singular value decomposition of a subspace mapping matrix and modifying certain components in a scaling matrix of the singular value decomposition.
17. A control system according to clause 16 wherein modifying certain components of the scaling matrix comprises setting those components to zero.
18. A control system according to clause 15 wherein reducing the dimensionality comprises performing at least one of: principal component analysis, a canonical variate analysis, a canonical correlation analysis or a discrete empirical interpolation method.
19. A control system according to any of clauses 13 to 18 wherein to calculate the model mapping, the historical performance measurements and historical position measurements are used together with historical correction data representing corrections that were applied in processing the prior substrates.
20. A control system according to any of clauses 13 to 19 wherein the substrate model is calculated with fewer degrees of freedom than the process model.
21. A control system according to clause 20 wherein the model mapping expresses the substrate model using the same degrees of freedom as the process model.

22. A control system according to clause 20 or 21 wherein the degrees of freedom of the process model are a superset of the degrees of freedom of the substrate model.
23. A control system according to any of clauses 13 to 22 wherein the process model comprises an inter-field model and an intra-field model.
24. A control system according to any of clauses 13 to 23 wherein the substrate model comprises an inter-field model and an intra-field model.
25. A method of manufacturing devices wherein device features and metrology targets are formed on a series of substrates by a lithographic process, wherein properties of the metrology targets on one or more processed substrates are measured by a method according to any of clauses 1 to 12, and wherein the measured properties are used to adjust parameters of the lithographic process for the processing of further substrates.
26. A lithographic apparatus including a measurement system, a patterning system and a control system, the control system being according to any of clauses 13 to 24.
27. A computer program product containing one or more sequences of machine-readable instructions for implementing the steps of a method of any of clauses 1 to 12.
28. A computer program product containing one or more sequences of machine-readable instructions for causing a processing device or system of processing devices to implement the control system of any of clauses 13 to 24.

CONCLUSION

By the techniques disclosed herein, the currently existing methods for correcting positional deviations in the received substrates and in the patterning process can be modified with a model mapping. In this way, the method can better establish the correlation between wafer alignment and overlay, and avoid systematic over-correction and under-correction.

Both the model mapping and process corrections can be trained together using historic performance data measured on prior substrates after patterning and alignment data measured on the prior substrates prior to patterning. The training calculations can be integrated in existing advanced process control loops, or in a new control system. New hardware is not required, to achieve improved overlay performance.

Decomposition the model mapping matrix can be applied to bring further benefits. Using a singular value decomposition, for example, a relevant subspace can be selected. Unnecessary processing can be avoided, while optimizing the achieved overlay.

If the substrate model includes model parameters for multiple sensor channels, for example different alignment colors or different signal processing algorithms, the model mapping can also solve problems related to process dependency and/or mark deformation. as well, using both color-to-color and shape information properties ("eigenwafers") of the mark deformation.

Information from the model mapping, for example from the singular value decomposition, can be analyzed to obtain insights into the nature of deformations and overlay errors, and potentially their root causes.

In association with the hardware of the lithographic apparatus and the lithocell LC, an embodiment may include a computer program containing one or more sequences of machine-readable instructions for causing the processors of the lithographic manufacturing system to implement methods of model mapping and control as described above. This computer program may be executed for example in a separate computer system employed for the image calculation/control process. Alternatively, the calculation steps may be wholly or partly performed within a processor a metrology tool, and/or the control unit LACU and/or supervisory control system SCS of FIGS. 1 and 2. There may also be provided a data storage medium (e.g., semiconductor memory, magnetic or optical disk) having such a computer program stored therein in non-transient form.

Although specific reference may have been made above to the use of embodiments of the invention in the context of optical lithography, it will be appreciated that the invention may be used in other applications, for example imprint lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
   obtaining a first value of each first parameter of a plurality of first parameters of a model based on fitting the model to positional data obtained from position measurements across a substrate;
   modifying, by a hardware computer system, one or more of the first values based on a characteristic of overlay data of a set of previous substrates, wherein the characteristic is associated with the first parameters of the model; and
   using the modified one or more first values in configuring a lithographic apparatus.
2. The method of claim 1, wherein the modifying uses a mapping operation, wherein the mapping is based on the characteristic.
3. The method of claim 2, wherein the mapping is expressed as a matrix.
4. The method of claim 2, wherein the mapping operation is a linear projection or a nonlinear projection.
5. The method of claim 1, wherein the first parameters define a model of one or more rotations and one or more magnifications, that at least partially describe a substrate deformation.
6. The method of claim 1, wherein the first parameters define a higher order model at least partially describing a substrate deformation.

7. The method of claim 6, wherein the higher order model comprises at least a 3rd and/or a 5th order polynomial term.

8. The method of claim 1, further comprising obtaining a second value of each second parameter of a plurality of second parameters of an overlay control model, wherein the second values are based on the overlay data.

9. The method of claim 8, wherein the overlay control model has more degrees of freedom than the model used in fitting the positional data.

10. The method of claim 9, wherein the modifying mapping is further based on extra degrees of freedom of the overlay control model and the use of the extra degrees of freedom in reducing correlation between the model and the overlay control model.

11. The method of claim 8, wherein the configuring of the lithographic apparatus is further based on one or more of the second values.

12. The method of claim 2, further comprising using the mapping to modify the model to obtain a modified model.

13. The method of claim 12, wherein the mapping is configured to provide a modified model having less degrees of freedom than the model.

14. The method of claim 13, wherein the mapping reduces the number of one or more insignificant first parameters comprised within the modified model compared to the number of one or more insignificant first parameters comprised within the model.

15. The method of claim 3, further comprising reducing the dimensionality of the matrix.

16. The method of claim 15, wherein the reducing comprises performing a singular value decomposition of the matrix.

17. The method of claim 16, wherein the positional data is obtained at a plurality of wavelength settings of the alignment system.

18. The method of claim 17, wherein at least a wavelength comprised within the plurality of wavelength settings is selected based on a sub-matrix obtained by performing a singular value decomposition of the matrix.

19. A non-transitory computer program product containing one or more sequences of machine-readable instructions therein, the instructions, upon execution by a computer system, configured to cause the computer system to at least:
obtain a first value of each first parameter of a plurality of first parameters of a model based on fitting the model to positional data obtained from position measurements across a substrate;
modify one or more of the first values based on a characteristic of overlay data of a set of previous substrates, wherein the characteristic is associated with the first parameters of the model; and
use the modified one or more first values in configuring the lithographic apparatus.

20. A computer system, comprising:
a hardware processor system; and
the non-transitory computer program product of claim 19.

21. The computer program product of claim 19, wherein the instructions configured to cause the computer system to modify one or more of the first values is configured to use a mapping operation, wherein the mapping is based on the characteristic.

22. The computer program product of claim 21, wherein the mapping is expressed as a matrix.

* * * * *